United States Patent [19]
Beratan et al.

[11] Patent Number: 5,602,043
[45] Date of Patent: Feb. 11, 1997

[54] MONOLITHIC THERMAL DETECTOR WITH PYROELECTRIC FILM AND METHOD

[75] Inventors: Howard R. Beratan; Charles M. Hanson, both of Richardson, Tex.

[73] Assignee: Texas Instruments Incorporated, Dallas, Tex.

[21] Appl. No.: 368,067

[22] Filed: Jan. 3, 1995

[51] Int. Cl.$^6$ ............................................. H01L 31/09
[52] U.S. Cl. .................... 437/3; 437/4; 250/332
[58] Field of Search ..................... 437/2, 3, 4, 247, 437/902; 148/DIG. 3, DIG. 80; 156/655.1, 643.1, 651.1; 250/370.08, 338.3, 338.4, 330, 332; 257/467, 470

[56] References Cited

U.S. PATENT DOCUMENTS

| | | | |
|---|---|---|---|
| 3,846,820 | 11/1974 | Lampe et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,205,227 | 8/1980 | Reed | 250/330 |
| 4,275,302 | 6/1981 | Imbert et al. | 250/330 |
| 4,379,232 | 4/1983 | Hopper | 250/332 |
| 4,593,456 | 6/1988 | Cheung | 437/3 |
| 4,594,507 | 6/1986 | Elliott et al. | 250/331 |
| 4,615,595 | 10/1986 | Hornbeck | 353/122 |
| 4,705,361 | 11/1987 | Frazier et al. | 350/355 |
| 4,710,732 | 12/1987 | Hornbeck | 332/7.51 |
| 4,751,387 | 6/1988 | Robillard | 250/331 |
| 4,956,619 | 9/1990 | Hornbeck | 330/4.3 |
| 4,994,672 | 2/1991 | Cross et al. | 250/330 |

(List continued on next page.)

FOREIGN PATENT DOCUMENTS

| | | | |
|---|---|---|---|
| 0939943 | of 1974 | Canada | 88/7.5 |
| 2251952 | of 1992 | United Kingdom | G20F 1/015 |
| 2282261 | 3/1995 | United Kingdom | 250/338.3 |
| 9116607 | of 1991 | WIPO | G01J 5/20 |

OTHER PUBLICATIONS

Stanley Wolf, Richard N. Tauber, "Silicon Processing for the VLSI ERA, vol. 1: Process Technology" *Lattice Press*, Sunset Beach, California, pp. 57–58, 110–113.

R. A. Wodd, et al. "HIDAD—A Monolithic, Silicon, Uncooled Infrared Imaging Focal Plane Array," 16.5/Wood/HiDAD pp. 579–581.

J. F. Li, et al., "Temperature Sensitivity of the Reflectance Coefficient of SbSI," *Ferroelectr. Lett. Sect.* 1990, 12(1), 1–7.

J. Li, et al., "Temperature dependence of optical constants of $MoS_2$ for Pyrooptical Devices," *Appl. Opt. 1991 (30(13) 1583–4*.

Primary Examiner—Tom Thomas
Assistant Examiner—S. Mulpuri
Attorney, Agent, or Firm—Brian A. Carlson; James C. Keterson; Richard L. Donaldson

[57] ABSTRACT

One or more thin film layers of material may be formed on an integrated circuit substrate and anisotropically etched to produce a monolithic thermal detector. A first layer of material may be placed on the integrated circuit substrate and anisotropically etched to form a plurality of supporting structures for the thermal sensors of the associated focal plane array. The thermal sensors of the focal plane array may be provided by anisotropically etching one or more thin film layers of material formed on the supporting structures. In an exemplary thermal detector, one of the thin film layers preferably includes pyroelectric material such as barium strontium titanate. A layer of thermal insulating material may be disposed between the integrated circuit substrate and the pyroelectric film layer to allow annealing of the pyroelectric film layer without causing damage to the associated integrated circuit substrate. In addition to the layer of insulating material, a heat sink may be disposed on the integrated circuit substrate opposite from the pyroelectric film layer to protect the integrated circuit substrate while annealing the pyroelectric film layer. Alternatively, a thermal isolation structure may be formed between the pyroelectric film layer and its associated supporting structures to allow annealing of the pyroelectric film layer without substantial heating of the underlying circuit substrate.

15 Claims, 2 Drawing Sheets

U.S. PATENT DOCUMENTS

| | | | |
|---|---|---|---|
| 5,010,251 | 4/1991 | Grinberg et al. | 250/332 |
| 5,021,663 | 6/1991 | Hornbeck | 250/349 |
| 5,036,197 | 7/1991 | Voles | 250/332 |
| 5,047,644 | 9/1991 | Meissner et al. | 250/332 |
| 5,051,591 | 9/1991 | Trotta et al. | 250/351 |
| 5,061,049 | 10/1991 | Hornbeck | 359/224 |
| 5,083,857 | 1/1992 | Hornbeck | 359/291 |
| 5,118,944 | 6/1992 | Mori et al. | 250/338.4 |
| 5,196,703 | 3/1993 | Keenan | 250/332 |
| 5,238,530 | 8/1993 | Douglas et al. | 156/635 |
| 5,264,326 | 11/1993 | Meissner et al. | 430/313 |
| 5,288,649 | 2/1994 | Keenan | 437/3 |
| 5,293,041 | 3/1994 | Kruse, Jr. | 250/338.4 |
| 5,367,167 | 11/1994 | Keenan | 250/338.4 |
| 5,369,280 | 11/1994 | Liddard et al. | 250/370.08 |
| 5,424,544 | 6/1995 | Shelton et al. | 250/332 |
| 5,426,304 | 6/1995 | Belcher | 250/332 |
| 5,457,318 | 10/1995 | Robinson et al. | 250/332 |
| 5,485,010 | 6/1996 | Owen et al. | 250/332 |
| 5,486,698 | 6/1996 | Hanson et al. | 250/332 |
| 5,512,748 | 4/1996 | Hanson | 250/332 |
| 5,521,104 | 5/1996 | Walker | 437/3 |
| 5,523,564 | 6/1996 | Yamada | 250/338.3 |

MONOLITHIC THERMAL DETECTOR WITH PYROELECTRIC FILM AND METHOD

RELATED APPLICATIONS

This application is related to copending application Ser. No. 08/229,497, entitled *Thermal Imaging System With Integrated Thermal Chopper and Method*, Attorney's Docket TI-18868, copending application Ser. No. 08/281,711, entitled *Thermal Imaging System With A Monolithic Focal Plane Array and Method*, Attorney's Docket TI-18817, and copending application Ser. No. 08/368/066, entitled *Focal Plane Array for Hybrid Thermal Imaging System and Method*, Attorney's Docket TI-18818. These applications are assigned to the same assignee.

TECHNICAL FIELD OF THE INVENTION

This invention relates generally to infrared or thermal imaging systems, and more particularly to monolithic thermal detectors with thin film pyroelectric materials and methods of fabrication.

BACKGROUND OF THE INVENTION

One common application for thermal sensors is in thermal (infrared) imaging devices such as night vision equipment. One such class of thermal imaging devices includes a focal plane array of thermal sensors having thermal sensitive elements. The focal plane array and its associated thermal sensors are often coupled to an integrated circuit substrate with a corresponding array of contact pads and a thermal isolation structure disposed between the focal plane array and the integrated circuit substrate. The thermal sensors typically define the respective picture elements or pixels of the resulting thermal image.

One type of thermal sensor includes a thermal sensitive element formed from pyroelectric material, such as barium strontium titanate (BST), that exhibits a state of electrical polarization and/or change in dielectric constant dependent upon temperature changes of the pyroelectric material in response to incident infrared radiation. For one such thermal sensor, an infrared absorber and common electrode assembly may be disposed on one side of the associated thermal sensitive element. A sensor signal electrode may be disposed on the opposite of the thermal sensitive element. The infrared absorber and common electrode assembly typically extends across the surface of an associated focal plane array and is attached to the thermal sensitive element of each thermal sensor in the focal plane array. Each thermal sensitive element preferably has its own separate sensor signal electrode. The common electrode and the sensor signal electrode constitute capacitive plates. The pyroelectric material constitutes a dielectric or insulator disposed between the capacitive plates.

Such thermal sensors are often incorporated into thermal imaging systems using hybrid solid state fabricating techniques. For some thermal sensors barium strontium titanate (BST) may be used to form the associated thermal sensitive elements. The starting place for fabricating such thermal sensitive elements is typically a wafer of barium strontium titanate or other suitable pyroelectric material having a diameter of approximately 4 inches and an approximate thickness of 0.1 inches. Various grinding and/or polishing processes are frequently used to reduce the thickness of the BST wafer to approximately 0.001 inches or less. The resulting focal plane array of thermal sensors formed from such pyroelectric material may be coupled with an integrated circuit substrate using bump-bonding procedures or other techniques associated with fabricating hybrid solid state systems.

SUMMARY OF THE INVENTION

In accordance with the present invention, the disadvantages and problems associated with previous thermal imaging systems having thermal sensors formed from pyroelectric material have been substantially reduced or eliminated. The present invention allows fabricating a monolithic thermal detector having a focal plane array and a plurality of thermal sensors formed in part from a thin film of pyroelectric material disposed on an integrated circuit substrate. One embodiment may include annealing a thin film layer of pyroelectric material disposed on an integrated circuit substrate at a temperature greater than the temperature limits normally associated with the integrated circuit substrate. Another aspect of the present invention may include the use of one or more anisotropic etching processes to form a monolithic thermal detector having a focal plane array with thermal sensors formed in part from one or more heterogenous film layers disposed on an integrated circuit substrate.

Important technical advantages of one embodiment may include forming one or more thin film layers of selected material on an integrated circuit substrate for use in fabricating a monolithic thermal detector and annealing the film layer or layers at a temperature substantially greater than the temperature limits associated with the integrated circuit substrate without causing any damage to the integrated circuit substrate. By forming one or more thin film layers of selected material on an integrated circuit substrate, costs may be substantially reduced and efficiency of the overall fabrication process improved. For one aspect of the present invention, one or more of the thin film layers will preferably be formed from pyroelectric material such as barium strontium titanate to provide thermal sensitive elements for the associated thermal sensors.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Figure 1:
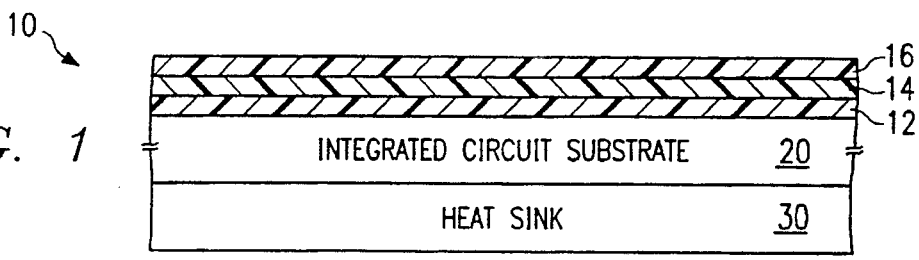
FIG. 1 is a schematic representation in elevation and in section with portions broken away showing a partially completed thermal detector with a heat sink disposed on one side of an integrated circuit substrate and at least three heterogenous film layers disposed on the opposite side of the integrated circuit substrate for use in fabricating a focal plane array and its associated thermal sensors in accordance with one embodiment of the present invention.
Figure 2:
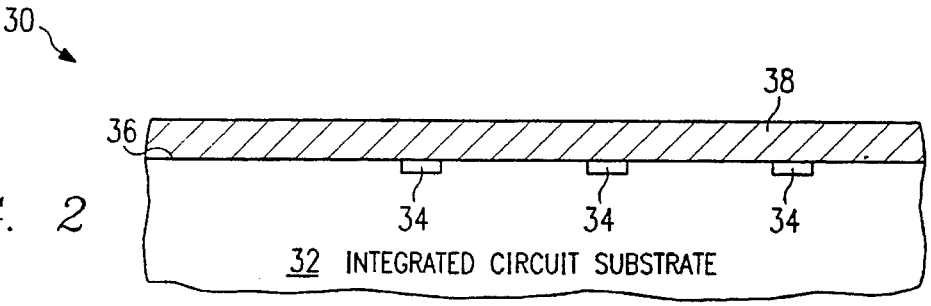
FIG. 2 is a schematic representation in section with portions broken away showing a first layer of material disposed on one side of an integrated circuit substrate for use in fabricating a monolithic thermal detector in accordance with another embodiment of the present invention.
Figure 3:
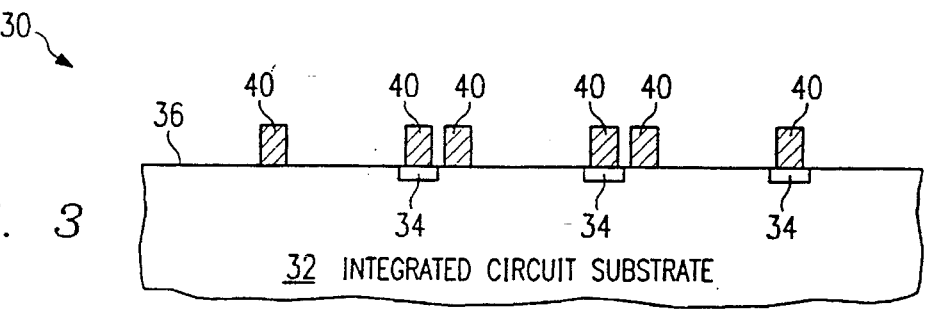
FIG. 3 is a schematic representation in section with portions broken away showing supporting structures formed from the first layer of material on the integrated circuit substrate of FIG. 2.

The preferred embodiments of the present invention and its advantages are best understood by referring to FIGS. 1–6 of the drawings, like numerals being used for like and corresponding parts of the various drawings.

Some infrared detectors and thermal imaging systems are based upon either the generation of a change in voltage due to a change in temperature resulting from incident infrared radiation striking a thermal sensor or the generation of a change in voltage due to a photonelectron interaction within the material used to form the thermal sensor. This latter effect is sometimes called the internal photoelectric effect. Other infrared detectors and thermal imaging systems are based upon the change in resistance of a thin conductor caused by the heating effect of incident infrared radiation. Such infrared detectors are sometimes referred to as bolometers.

Thermal imaging systems and thermal detectors constructed in accordance with the teachings of the present invention may function based upon the generation of a change in voltage and/or current due to a change in temperature of pyroelectric material resulting from incident infrared radiation. However, the present invention may also be used with other types of thermal detectors including bolometers.

One of the problems associated with forming a film layer of refractory material on an integrated surface substrate results from the relatively high annealing temperature (600° C. or greater) to establish the desired pyroelectric and/or bolometric characteristics in the film layer and the relatively low temperature limits (450° C. or less) typically associated with fabrication of integrated circuit substrates. The present invention solves this problem by providing sufficient thermal isolation to allow annealing of film layers at 600° C. or higher without exceeding the upper temperature limit of the associated integrated circuit substrate.

For some applications a heat sink or heat exchanger may be used to control the temperature of the integrated circuit substrate to within satisfactory limits during high temperature annealing of one or more film layers formed on the surface of the integrated substrate. One of the results of the present invention is a monolithic thermal detector having a focal plane array formed from heterogenous thin film layers including at least one layer of pyroelectric or bolometric material. Anisotropic etching techniques may be used to form the desired thermal sensors from the heterogenous film layers. The present invention also allows fabricating a wide variety of monolithic thermal detectors having various types of focal plane arrays disposed on an integrated circuit substrate.

Various types of semiconductor materials and integrated circuit substrates may be used with the present invention. U.S. Pat. No. 4,143,269 entitled "Ferroelectric Imaging System," issued to McCormack, et al. and assigned to Texas Instruments Incorporated, provides information concerning infrared detectors fabricated from ferroelectric materials and a silicon switching matrix or integrated circuit substrate. U.S. Pat. No. 5,047,644 entitled "Polyimide Thermal Isolation Mesa For A Thermal Imaging System," issued to Meissner, et al. and assigned to Texas Instruments Incorporated, discloses a thermal isolation structure having thermal isolation mesa-type formations formed from polyimide. These thermal isolation structures may also be formed from polyimide.

One embodiment of the present invention may be represented by thermal detector 10 which is shown in FIG. 1 during an intermediate fabrication step. For purposes of explanation, film layers 12, 14 and 16 are shown on one side or surface of integrated circuit substrate 20 with heat sink 30 disposed on the opposite thereof. As will be explained later in more detail, film layers 12, 14 and 16 may be formed from various types of material such as polyimide to function as a thermal barrier, barium strontium titanate or other pyroelectric materials to provide thermal sensitive elements for the resulting thermal sensors, and other types of material such as an electrical conductive film. The types of material and the number of layers may be selected depending upon the focal plane array design and the type of thermal sensors which will be formed on integrated circuit substrate 20.

One or more anisotropic etching processes such as oxygen based reactive ion etch (RIE) or magnetically enhanced reactive ion etch (MERIE) may be applied to heterogenous thin film layers 12, 14 and 16 to form the desired thermal sensors which will comprise the resulting focal plane array on integrated circuit substrate 20. The selection of anisotropic etching techniques and the sequence for applying each anisotropic etch will depend upon the materials used to form each film layer 12, 14 and 16 and the desired configuration for the resulting thermal sensors.

For some applications, layer 12 may be formed from polyimide or other low thermal conductivity material to protect integrated circuit substrate 20 during heat treating or annealing of thin film layers 14 and/or 16. For those applications in which thin film layers 14 and/or 16 require relatively high annealing temperatures, heat sink 30 may be disposed on the opposite side or surface of integrated circuit substrate 20 to cooperate with layer 12 of thermal insulating material to protect integrated circuit substrate 20. For example, if thin film layer 14 is formed from a pyroelectric material such as barium strontium titanate, the required annealing temperature may be as high as 900° C. to establish the desired pyroelectric characteristics. The upper temperature limit for fabricating an integrated circuit substrate without causing damage to components within the substrate is typically 400° C. to 450° C. Thermal insulating layer 12 and heat sink 30 will cooperate with each other to maintain the temperature of integrated circuit substrate 20 below its associated upper temperature limit during annealing of layers 14 and 16. For some applications, heat sink 30 may be a heat exchanger or a thermoelectric device which is used to actively cool integrated circuit substrate 20 during the annealing process.

Important features of the present invention include providing the necessary cooling to allow heat treating and/or annealing of the various thin film layers formed on integrated circuit substrate 20. For some applications, thermal insulating layer 12 may provide sufficient protection for integrated circuit substrate 20 without requiring the use of heat sink 30.

Another embodiment of the present invention is shown in FIGS. 2–5 which depict various steps during the process of fabricating monolithic thermal detector 30 having focal plane array 50 with thermal sensors 52 disposed on integrated circuit substrate 32. An array of contact pads 34 are preferably disposed on one side or surface 36 of integrated circuit substrate 32 to receive a sensor signal from the respective thermal sensors 52.

First layer 38 of material which will be used to provide supporting structures 40 for the respective thermal sensors 52 is preferably deposited or formed on first surface 36. Using anisotropic etching or other photolithographic techniques, supporting structures 40 for thermal sensors 52 may be formed on surface 36 of integrated circuit substrate 32. For the embodiment of the present invention shown in FIGS. 2–5, each thermal sensor 52 preferably includes a pair of supporting structures 40 with at least one supporting structure 40 disposed on the respective contact pad 34. For one application, first layer 38 and the resulting supporting structures 40 may be formed from aluminum. However other types of material may be used to provide supporting structures 40 depending upon the type of thermal sensor 52 which will be fabricated on integrated circuit substrate 32.

Second layer 42 of thermal insulating material is next formed on surface 36 with supporting structures 40 disposed therein. For one application, polyimide may be selected as the insulating material to form second layer 42. However, other types of insulating material may be used with the present invention depending upon the annealing temperature associated with the thin film layers used to form the respective thermal sensors 52 and the upper temperature limit associated with integrated circuit substrate 32. For some applications, a thermal isolation structure may be formed between the film layers and the associated supporting structures 40 such that second layer 42 may not be required to protect integrated circuit substrate 32 while annealing the respective film layer.

Figure 4:
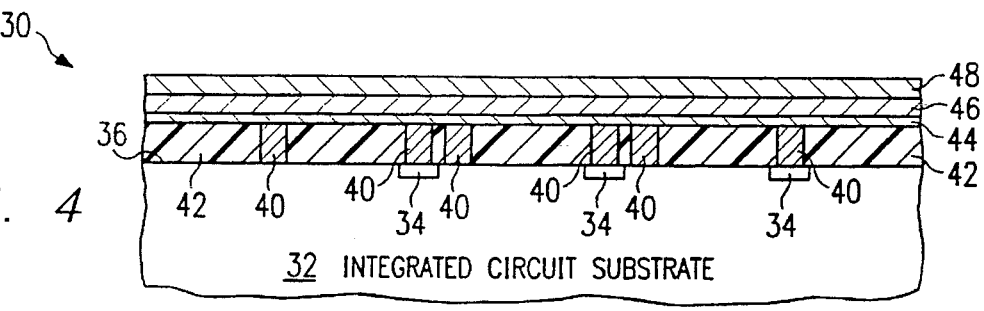
FIG. 4 is a schematic representation in section with portions broken away showing an intermediate step during fabrication of a monolithic thermal detector from multiple heterogenous film layers disposed on the integrated circuit substrate of FIG. 3.

As best shown in FIG. 4, a first layer of electrically conductive material 44 is next formed on thermal insulating layer 42 and the top of each supporting structure 40. A thin film layer of pyroelectric material may next be formed on surface 36 of integrated circuit substrate 32 with first layer 44 of electrically conductive material, supporting structures 40 and second layer 42 of thermal insulating material disposed therebetween. Second layer 48 of electrically conductive material may then be formed on pyroelectric film layer 46 opposite from first layer 44 of electrically conductive material. Layers 44 and 48 may be formed from various types of material such as nickel and platinum. However, the present invention allows other types of electrically conductive material may be used depending upon the type of thermal sensor which will be formed on integrated circuit substrate 32.

For one application, film layer 46 is preferably formed from pyroelectric material such as barium strontium titanate (BST). For other applications, materials in the lead titanate family including lead titanate (PT), lead lanthanum titanate (PLT), lead zirconate titanate (PZT), and lead lanthanum zirconate titanate (PZLT) may be used to form film layer 46. The selection of material for film layer 46 depends upon the type of thermal sensor which will be formed on integrated circuit substrate 32. Depending upon the type of materials used to form layers 42, 44, 46 and 48, one or more buffer layers or protective layers (not shown) may be disposed between surface 36 of integrated circuit substrate 32 and/or layers 42, 44, 46 and 48.

For those applications in which film layer 46 is formed from pyroelectric material such as barium strontium titanate, it may be desirable to anneal layer 46 prior to applying second layer 48 of electrically conductive material. Annealing of layer 46 is generally required to establish the desired pyroelectric characteristics required for the resulting thermal sensors 52. As previously noted, the annealing temperature for barium strontium titanate may be as high as 900° C. At the same time, the upper temperature limit for fabricating integrated circuit substrate 32 without causing damage to the components within substrate 32 may typically be 400° C. to 450° C. Thus, an important feature of the present invention includes providing thermal insulating layer 42 between pyroelectric film layer 46 and integrated circuit substrate 32 to allow annealing of pyroelectric film layer 46 without causing any damage to integrated circuit substrate 32.

After forming supporting structures 40 and the desired layers of material 42, 44, 46 and 48 on surface 36 of integrated circuit substrate 32, various photolithographic techniques including anisotropic etching processes may be used to form the desired thermal sensors 52. Depending upon the type of materials used to form layers 42, 44, 46 and 48, the anisotropic etching processes may include oxygen-based reactive ion etch (RIE) or a magnetically enhanced reactive ion etch (MERIE). The resulting thermal sensors 52 will preferably include a cavity or void space 54 between pyroelectric element 46 and surface 36 of integrated circuit substrate 32. Typically void space 54 will have a height which corresponds to one quarter of the wavelength of the incident infrared radiation which will be detected by thermal sensors 52. For one application, supporting structures 40 and the associated void space 54 have a height of approximately 2½ microns.

Figure 5:
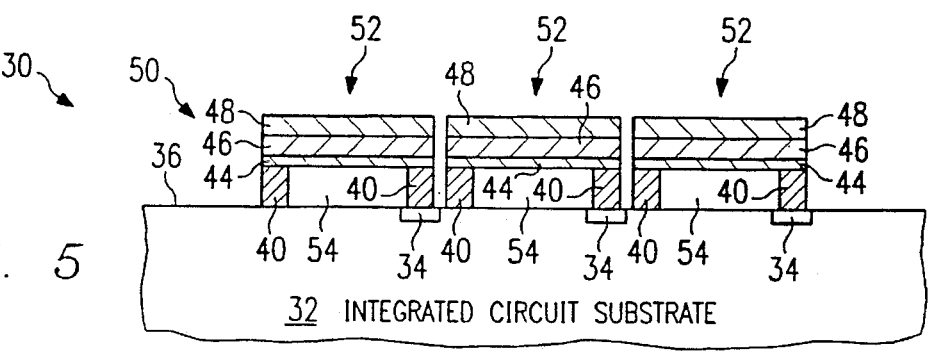
FIG. 5 is a schematic representation in section with portions broken away showing a monolithic thermal detector having a focal plane array and its associated thermal sensors formed on the integrated circuit substrate of FIG. 4.

For monolithic thermal detector 30 shown in FIG. 5, supporting structures 40 provide both mechanical support for the associated thermal sensor 52 and a signal flowpath to the associated contact pad 34. As will be described later in more detail, the present invention may be used to provide a wide variety of signal flowpaths between the thermal sensors and the associated integrated circuit substrate. Various processes such as sputter deposition, reactive sputtering, chemical vapor deposition, and/or evaporation deposition processes may be used to form layers 38, 42, 44, 46 and 48 as appropriate.

Figure 6:
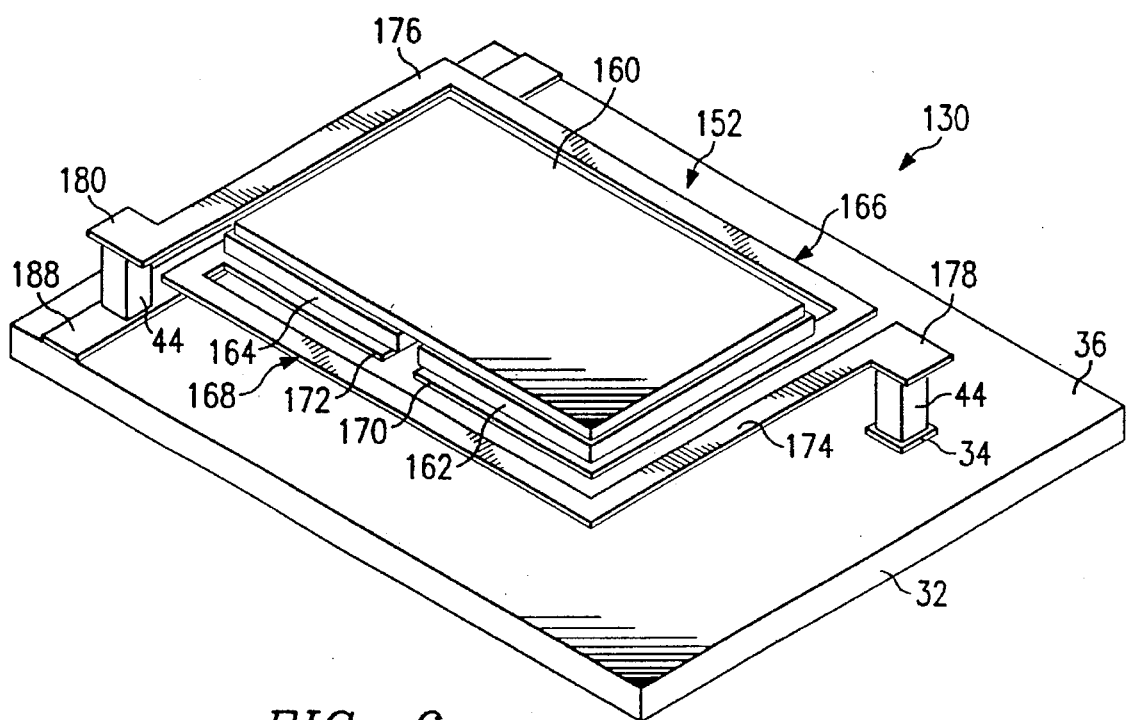
FIG. 6 is an isometric representation with portions broken away of a monolithic thermal detector showing a thermal sensor formed from heterogenous film layers disposed on an integrated circuit substrate incorporating a further embodiment of the present invention.

As shown in FIG. 6, thermal sensor 152 which forms a portion of monolithic thermal detector 130 represents another embodiment of the present invention. For some applications monolithic thermal detector 30 would preferably include a large number of thermal sensors 152 formed on surface 36 of integrated circuit substrate 32 in accordance with the teachings of the present invention. Thermal sensor 152 includes common plate 160 which may be formed from second layer 44 electrically conductive material. Electrically coupled to and directly underlying common plate 160 are a pair of pixel elements 162 and 164 which may be formed from film layer 46. It should be noted that the present invention contemplates forming layer 46 and the resulting pixel elements 162 and 164 from pyroelectric material, bolometric material such as amorphous silicon and vanadium oxide (VO) or any other temperature sensitive material that provides a satisfactory signal in response to incident infrared radiation.

Pixel elements 162 and 164 may preferably be coupled on one side to common plate 160 and on the other side to a pair of electrodes 166 and 168, respectively. Pixel elements 162 and corresponding electrode 166 are electrically isolated from pixel element 164 and corresponding electrode 168, except for common plate 160, which provides a signal path between pixel elements 162 and 164. Electrodes 166 and

168 may be formed from first layer of electrically conductive material 44. Electrodes 166 and 168 are designed to provide electrical coupling between pixel elements 162 and 164 and integrated circuit substrate 32 through the respective contact pad 34. Electrodes 166 and 168 each comprise corresponding mounting areas 170 and 172, flexible arms or leads 174 and 176 and contact areas 178 and 180. Flexible leads 174 and 176 are also designed to provide thermal isolation between pixel elements 164 and 162.

For the embodiment of the present invention represented by thermal sensor 152, second layer 42 may be removed prior to annealing pixel elements 162 and 164. Thus second layer 42 could be formed from a material such as silicon dioxide (SiO2) rather than polyimide. The various components of each thermal sensor 152 may be formed from anisotropically etching the appropriate homogenous thin film layers formed on surface 36 of integrated circuit substrate 32. The thermal isolation structure represented by flexible lead 174 and 176 allows annealing of pixel elements 162 and 164 without causing any damage to integrated circuit substrate 32. For one application of the present invention, a light bulb (not shown) may provide sufficient thermal energy to raise the temperature of pixel elements 164 and 162 to their required annealing temperature without damaging the associated integrated circuit substrate 32.

As shown in FIG. 6, integrated circuit substrate 32 may include a common bias voltage bus 188 which supplies bias voltage to pixel elements 162 and 164. However, for some applications of the present invention, bias voltage may not be required and common bus 188 may represent ground potential.

It should be understood that the present invention contemplates forming thin film layers from pyro-optical material and/or pyroelectrical material as required for the specific types of thermal sensor. Also thin film layers may be formed from various bolometric materials. U.S. Pat. No. 5,021,663 to Hornbeck and assigned to Texas Instruments, Inc., the assignee of this invention, shows a bolometer with bifurcated leads. The present invention may be used to fabricate a wide variety of monolithic thermal detectors including bolometers.

The quantity and configuration of thermal sensors 52 and 152 depends on the desired N by M pixel resolution for the associated focal plane array. In operation, thermal detectors 30 and 130 may be used to produce a thermal image in response to incident infrared radiation striking the associated focal plane array. The total sensor signal output from thermal sensors 52 and 152 will depend upon the incident infrared radiation.

Although the present invention has been described with several embodiments, various changes and modifications may be suggested to one skilled in the art, and it is intended that the present invention encompass such changes and modifications as fall within the scope of the appended claims.

What is claimed is:

1. A method for fabricating a monolithic thermal detector having a focal plane array of thermal sensors disposed on an integrated circuit substrate comprising the steps of:

forming a first layer of electrically conductive material on one surface of the integrated circuit substrate;

anisotropically etching the first layer of electrically conductive material to form supporting structures for respective thermal sensors;

forming a second layer of thermal insulating material on the one surface of the integrated circuit substrate with the supporting structures disposed therein;

forming a third layer of electrically conductive material on the supporting structures and the layer of insulating material;

forming a thin film layer of thermal sensitive material on the third layer of electrically conductive material;

forming a fourth layer of electrically conductive material on the thin film layer;

etching the layer of thermal insulating material, the third and fourth layers of electrically conductive material and the thin film layer of thermal sensitive material to form the plurality of thermal sensors which comprise the focal plane array disposed on the integrated circuit substrate; and applying heat to one side of the thin film layer of thermal sensitive material with the layer of thermal insulating material disposed between the one surface of the integrated circuit substrate and the thin film layer of thermal sensitive material to anneal the thin film layer.

2. The method of claim 1, wherein the second layer of thermal insulating material is formed from polyimide.

3. The method of claim 1, wherein the thin film layer is formed from material selected from the group consisting of barium strontium titanate, barium titanate, antimony sulfoiodide, vanadium oxide, lead titanate, lead lanthanum titanate, lead zirconate titanate, lead lanthanum zirconate titanate and amorphous silicon.

4. The method of claim 1, wherein the step of anisotropically etching is performed using an oxygen-based reactive ion etch.

5. The method of claim 1, wherein the step of forming the supporting structure is performed using a photolithographic process.

6. The method of claim 1, further comprising the step of placing a heat sink on the integrated circuit substrate opposite from the one surface of the integrated circuit substrate.

7. A method for fabricating a monolithic thermal detector having a focal plane array of thermal sensors disposed on one surface of an integrated substrate with an array of contact pads for respectively receiving signals from the thermal sensors, comprising the steps of:

forming a first layer of electrically conductive material on the one surface of the integrated circuit substrate;

anisotropically etching the first layer of electrically conductive material to form supporting structures for the respective thermal sensors with at least one of the supporting structures disposed adjacent to the contact pad for the respective thermal sensor;

forming a second layer of insulating material on the one surface of the integrated circuit substrate with the supporting structures disposed therein;

forming third layer of electrically conductive material on the supporting structures and the layer of insulating material;

forming a thin film layer of pyroelectric material on the third layer of electrically conductive material;

forming a fourth layer of electrically conductive material on the thin film layer;

etching the layer of insulating material, the third and fourth layers of electrically conductive material and the thin film layer of pyroelectric material to form the thermal sensors which comprise the focal plane array disposed on the integrated circuit substrate; and annealing the thin film layer of pyroelectric material.

8. The method of claim 7, further comprising the steps of:

etching the thin film layer of pyroelectric material to form respective thermal isolation structures between the thermal sensors and their associated supporting structures; and annealing the thin film layer of pyroelectric material after the thermal isolation structures have been formed.

9. The method of claim 7 wherein the second layer of insulating material is formed from silicon dioxide.

10. The method of claim 7, further comprising the steps of:

patterning the film layers formed on the supporting structures and the layer of insulating material to correspond with the desired thermal sensors; and anisotropically etching the film layers and the layer of insulating material to form the thermal sensors which comprise the focal plane array disposed on the integrated circuit substrate.

11. The method of claim 7, wherein the insulating material is polyimide.

12. The method of claim 7, wherein the step of anisotropically etching is performed using an magnetically enhanced reactive ion etch.

13. The method of claim 1, wherein the thin film layer is pyroelectric.

14. The method of claim 1, further comprising the step of:

removing the layer of thermal insulating material to form cavities between said integrated circuit substrate and each of said thermal sensors.

15. The method of claim 7, further comprising the step of:

removing the layer of insulating material to form cavities between said integrated circuit substrate and each of said thermal sensors.

* * * * *